(12) United States Patent
Parailloux et al.

(10) Patent No.: US 11,643,718 B2
(45) Date of Patent: May 9, 2023

(54) TILTABLE AND ROTATABLE SUBSTRATE CARRIER AND MULTI-LAYER VACUUM DEPOSITION SYSTEM COMPRISING SAME

(71) Applicant: SAFRAN ELECTRONICS & DEFENSE, Paris (FR)

(72) Inventors: Maxime Parailloux, Boulogne (FR); Joël Fleury, Boulogne (FR); Cyril Dupeyrat, Boulogne (FR)

(73) Assignee: SAFRAN ELECTRONICS & DEFENSE, Paris (FR)

( * ) Notice: Subject to any disclaimer, the term of this patent is extended or adjusted under 35 U.S.C. 154(b) by 0 days.

(21) Appl. No.: 17/773,938

(22) PCT Filed: Oct. 27, 2020

(86) PCT No.: PCT/FR2020/051942
§ 371 (c)(1),
(2) Date: May 3, 2022

(87) PCT Pub. No.: WO2021/094665
PCT Pub. Date: May 20, 2021

(65) Prior Publication Data
US 2022/0349043 A1 Nov. 3, 2022

(30) Foreign Application Priority Data
Nov. 14, 2019 (FR) ...................................... 1912702

(51) Int. Cl.
*C23C 14/50* (2006.01)
*C23C 14/54* (2006.01)
(Continued)

(52) U.S. Cl.
CPC .............. *C23C 14/54* (2013.01); *C23C 14/24* (2013.01); *C23C 14/505* (2013.01); *H01L 21/67253* (2013.01); *H01L 21/68764* (2013.01)

(58) Field of Classification Search
None
See application file for complete search history.

(56) References Cited

U.S. PATENT DOCUMENTS 3,889,632 A * 6/1975 Brunner ................ C23C 14/505
 118/730
4,816,133 A * 3/1989 Barnett ................... C23C 14/46
 118/500

(Continued)

OTHER PUBLICATIONS

International Search Report dated Mar. 11, 2021, issued in corresponding International Application No. PCT/FR2020/051942, filed Oct. 27, 2020, 7 pages.

(Continued)

*Primary Examiner* — Charles Capozzi
(74) *Attorney, Agent, or Firm* — Christensen O'Connor Johnson Kindness PLLC (57) ABSTRACT

A module for operating a carrier of one or more substrates to be treated in a vacuum deposition method includes a frame provided with a plate receiving, on a first side, an electronic assembly comprising radio transmitter/receiver electronics, a processor card, motor controller electronics and a battery for supplying power to the module. The processor card has a program memory with a program for controlling the motor controller electronics according to data received from a remote apparatus provided with a radio transmitting/receiving device for communicating with the module's radio transmitter/receiver electronics and, on a second side, a device for operating the carrier, which device is provided with a first motor for rotating the carrier about (Continued)

a first axis parallel to the plate and with a second motor for rotating the carrier about a second axis perpendicular to the plate.

19 Claims, 5 Drawing Sheets

(51) Int. Cl.
    *C23C 14/24*     (2006.01)
    *H01L 21/67*     (2006.01)
    *H01L 21/687*     (2006.01)

(56) References Cited

U.S. PATENT DOCUMENTS

| | | |
|---|---|---|
| 2003/0178729 A1 | 9/2003 | Ahn et al. |
| 2003/0202092 A1 | 10/2003 | Sadighi et al. |
| 2006/0255138 A1 | 11/2006 | Chang |
| 2008/0224327 A1 | 9/2008 | Suh et al. |
| 2016/0177450 A1* | 6/2016 | Kanno .................... C23C 16/46 427/535 |
| 2017/0229331 A1* | 8/2017 | Nosrati ............... B05C 11/1015 |

OTHER PUBLICATIONS

Written Opinion dated Mar. 11, 2021, issued in corresponding International Application No. PCT/FR2020/051942, filed Oct. 27, 2020, 7 pages.

English translation of Written Opinion dated Mar. 11, 2021, issued in corresponding International Application No. PCT/FR2020/051942, filed Oct. 27, 2020, 5 pages.

International Preliminary Report on Patentability dated May 17, 2022, issued in corresponding International Application No. PCT/FR2020/051942, filed Oct. 27, 2020, 8 pages.

\* cited by examiner

TILTABLE AND ROTATABLE SUBSTRATE CARRIER AND MULTI-LAYER VACUUM DEPOSITION SYSTEM COMPRISING SAME

TECHNICAL FIELD

The present application relates to the field of mechatronics applied to vacuum deposition on substrates to be treated and in particular to the deposition of structured multilayer optical treatments on optical parts, for example in the context of treatments performed with a method known by the acronym GLAD, derived from the expression "glancing angle deposition" which notably means deposition with oblique angle of incidence.

PRIOR ART

The production of structured multilayered depositions according to the GLAD method is in the state of the art in the field of the researching and studying of optimized optical performance or is applied to unity parts. The issues raised by the industrialization of this method are not yet resolved, and in particular the means for treating many parts at the same time in a vacuum chamber and accurately manipulating such parts for a deposition of multiple treatment layers without opening the vacuum chamber are not known in particular for optics of lens or windows type of large dimensions, for example up to dimensions of 140 mm in diameter.

TECHNICAL PROBLEM

The problem with multilayer depositions by the GLAD method is linked to the need to control precise movements, in inclination and in azimuthal rotation, whether discrete or continuous, of optical parts in a vacuum chamber; said optical parts being fixed onto a plate possibly mounted on a revolving carousel in order to treat a large number thereof at the same time; the deposition of the various layers having to be done without intermediate openings of the chamber in order to avoid the ingress of moisture.

Without integrated robotics, the implementation of discrete or continuous movements on a revolving support, inside a metal vacuum chamber, poses problems that are difficult to overcome in terms of mechanical and electrical drive, particularly for industrial series production.

That is made particularly complex by the fact that the use of out-of-cavity motors for maneuvering the revolving supports involves excessive strains, that wired control of the maneuvering devices through the wall of the chamber is too complex in the case where several robotic devices are present in the chamber, and by the fact that the discharge by convection of the heat generated by the operation of maneuvering devices is impossible in a vacuum chamber.

SUMMARY OF THE INVENTION

To address these constraints, the present application relates, on the one hand, to the realization of a module with integrated motorization which notably makes it possible to perform treatments according to a deposition method such as the GLAD method in a vacuum chamber and, on the other hand, a vacuum deposition machine equipped with such a module.

This module must be autonomous, compact and secure and usable in all types of thin layered deposition systems.

More specifically, the present application proposes a module for maneuvering a support of one or more substrates to be treated in a vacuum deposition method, which comprises a frame provided with a plate receiving, on a first side, an electronic assembly comprising radio transmission/reception electronics, a processor board, motor control electronics and a power supply battery for the module, the processor board comprising a program memory comprising a driver program for the motor control electronics based on data received from a remote device provided with a radio transmitter/receiver device for communication with the transmission/reception electronics of the module and, on a second side, with a device for maneuvering said support provided with a first motor for maneuvering said support in rotation about a first axis parallel to the plate and a second motor for maneuvering said support in rotation about a second axis at right angles to said support.

The architecture of this module for which the electronic part is separate from the part for maneuvering the support of said substrates by a plate can easily be integrated in a vacuum deposition machine, the plate making it possible to isolate the electronic part from the maneuvering part which undergoes the high temperatures of the treatment method.

The features of the module explained in the following paragraphs can, optionally, be implemented. They can be implemented independently of one another or in combination with one another:

The module can be such that the motor control electronics is low-voltage electronics and the motors are micro-servomotors that can be electrically driven at low voltage.

The maneuvering device of the module can comprise a cover receiving a housing mobile in rotation with respect to the cover about the first axis under the action of the first motor for maneuvering the housing tiltwise, said support being linked to the second motor linked by a rotary shaft, on the second axis.

The housing advantageously encloses the second motor which is configured to drive the rotation of the support of said substrates in its plane about the second axis.

A balancing weight can be disposed so as to compensate the weight of the support equipped with its substrate or substrates to be treated with respect to said first axis.

The cover can comprise a base formed by the plate and two arms of which a distal end bears the first axis.

The arms and the plate are notably a single part.

One of the arms of the cover can receive a tube for mounting said housing about the first axis provided with a grommet to serve as entry for power supply and control cables for the motors from the motor control electronics and passing through the plate.

The first of said motors can advantageously be disposed in the housing to be protected from the effects of the deposition method.

This motor can comprise a motor shaft received in one of the arms of the cover in order to rotate the housing with respect to the cover on the first axis which simplifies the design of the module.

The module can comprise one or more temperature sensors at at least one motor and/or the electronic assembly and/or the substrate support and linked to the processor board, the driver program for the motor control electronics being provided with a temperature management module suitable for transmitting temperature data through the radio communication electronics to said remote device provided with a module operation supervision program.

The plate can constitute a means for fixing the module onto a module support passed through by the module.

According to another aspect, the present application proposes a vacuum deposition machine comprising a vacuum chamber and means for depositing thin layers on a substrate in the vacuum chamber, which comprises at least one module as described above disposed in the chamber, a remote device provided with a module operation supervision program disposed outside of the chamber, said remote device being provided with a radio transmitter/receiver device suitable for setting up a radio link with the transmission/reception electronics of said module to drive the movements of the housing and of the substrate support.

The features of the deposition machine set out in the following paragraphs can, optionally, be implemented. They can be implemented independently of one another or in combination with one another:

The machine can comprise a plurality of modules according to the application fixed onto a module support such as a revolving carousel disposed in the chamber.

The modules and the carousel can be driven together or independently by said remote device to orient the substrates borne by the substrate supports with respect to the deposition means according to variable incidences during a vacuum multilayer deposition method.

This makes it possible to simultaneously treat multiple substrates and have a high degree of uniformity of the treatments between the substrates.

The carousel advantageously forms a thermal separation between the side of the modules provided with the electronic assembly and the side of the modules provided with the maneuvering device and the substrate support. That increases the protection of the electronics of the modules with respect to temperatures and depositions of the treatment method on the substrates.

The remote device is advantageously a computer or industrial calculator provided with a human-machine interface suitable for programming multilayer deposition conditions by an operator and interfaced with the modules through the radio link to remotely drive the modules disposed in the chamber on the basis of said programming.

BRIEF DESCRIPTION OF THE DRAWINGS

Other features, details and advantages of the invention will become apparent on reading the following detailed description, and on analyzing the attached drawings, in which.

DESCRIPTION OF THE EMBODIMENTS

The drawings and the description below contain, for the most part, elements of a certain nature. They will therefore not only be able to serve to better understand the present invention, but also contribute to the definition thereof, as appropriate.

Figure 1:
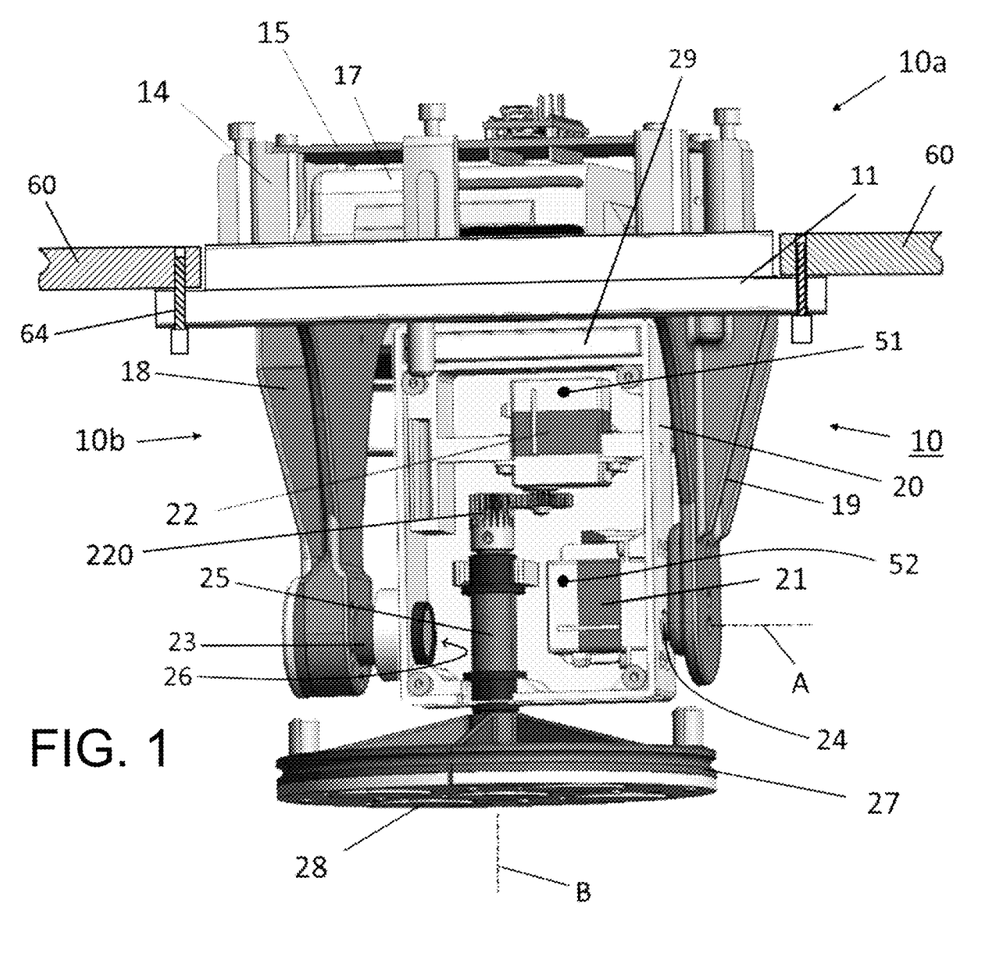
FIG. 1 shows a maneuvering module in perspective according to an embodiment of the invention.

Reference is now made to FIG. 1 which describes a module 10 for maneuvering a substrate support 27 receiving one or more substrates 28 such as optical parts to be treated in a vacuum deposition method like a GLAD method. This module will be used in the vacuum chamber of a vacuum deposition machine. For such a method, it is necessary to orient and rotate the substrate or substrates to be treated with respect to a vapor flow source with a given deposition angle. In the case of a multilayer deposition, the substrate will be oriented differently according to the layers to be deposited and the continuity of the vacuum must be maintained between the different layers deposited.

The substrate support can support a substrate of large diameter or, as represented, several substrates on which the deposits will be made simultaneously and according to the same deposition angle.

The module 10 comprises a frame provided with a plate 11 disposed between a first side 10a of the module bearing a control electronic part and a second side 10b of the module bearing an electromechanical part for maneuvering the substrate support which is provided with motors for maneuvering said support 27.

Figure 2:
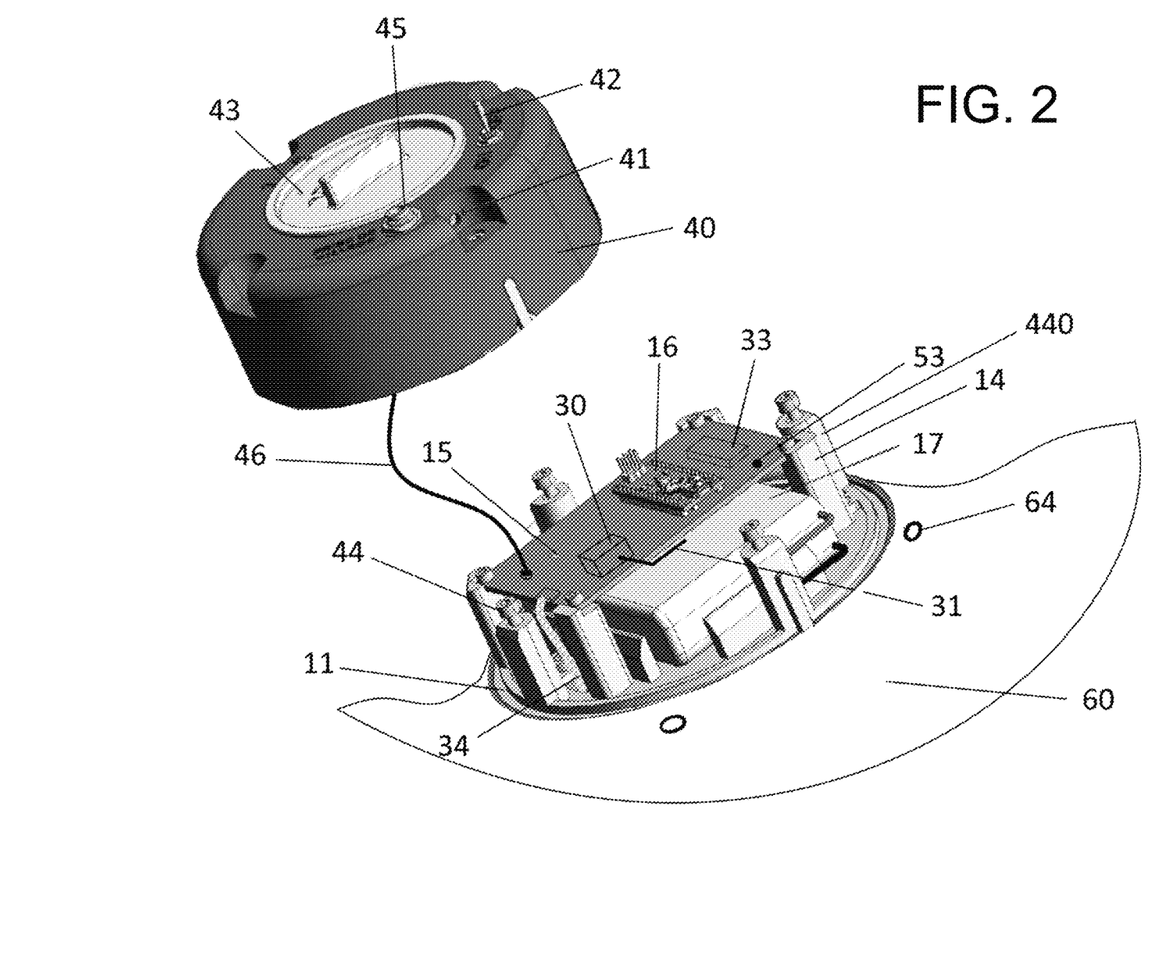
FIG. 2 shows a perspective view of the top part of the module of FIG. 1.

On the control electronics side according to FIG. 2, the frame comprises, in extension of the top face of the plate, a fixing device for an electronic assembly 15 comprising radio transmission/reception electronics 30, 31, a processor board 16, motor control electronics 33 linked to the motors by a cable 34. These various devices can be grouped together on a single electronic circuit board or on a motherboard fixed to the plate by means of columns forming the fixing device 14 as represented in FIG. 2.

The transmission/reception electronics is, for example, a board or a 433 MHZ RF module with its antenna 31 or a Wifi or Bluetooth module suitable for working at high temperature.

Still on this first side of the module, there is a power supply battery 17 for the module which makes the module autonomous and avoids the need for complex wire power supply links to be implemented in a vacuum chamber in which the module is located.

The battery is preferably a high-capacity leakproof li-ion battery operating in a vacuum and at high temperature, for example up to 90° C., and which more generally meets spatial characteristics. It can be recharged through a connector on the electronic circuit board or on a cap covering this board.

The processor board can be produced with a microcontroller or a microprocessor and comprise a program memory in which is installed a driver program for the motor control electronics of the electromechanical part for maneuvering the substrate support.

Returning to FIG. 1, the module further comprises, on a second side 10b, under the plate, a device for maneuvering the support of the substrate or substrates to be treated which will make it possible to rotate the support on itself parallel to its plane but also tilt this support with respect to an axis at right angles to the plate which serves as reference plane for the positioning of said support.

To maneuver the substrate support, the maneuvering device is provided with a first motor 21 for maneuvering the substrate support in rotation with respect to a first axis A parallel to the plate.

The device is provided with a second motor 22 for maneuvering the substrate support 27 in rotation in a plane of the support 27 about a second axis B at right angles to the support.

The second axis is also at right angles to the first axis such that the support away from the first axis is in circular orbit about this first axis.

Thus, under the action of the two motors, the substrate support can be displaced tiltwise with respect to the plate and rotate on itself.

The motors are, for example, micro-servomotors that can be electronically controlled at low voltage by the motor control electronics which are themselves low-voltage electronics of known type for the control of such motors.

The maneuvering device as represented comprises a cover composed of the plate 11 and two arms 18, 19 in extension of the bottom face of the plate and provided with distal ends forming a pivot link on the first axis A for a housing 20 that is rotationally mobile with respect to the cover about the first axis A.

Advantageously, the plate 11, the electronic circuit board fixing device and the arms 18 and 19 are a single part produced by 3D printing.

The first motor 21 is positioned in the housing 20 to be protected thereby and is positioned to maneuver the housing 20 in rotation about the axis A, that is to say tiltwise with respect to the module 10.

According to the example, the motor shaft 24 leaving the motor 21 is received in one of the arms 19 of the cover and forms the axis A of rotation of the housing with respect to the cover.

The support 27 of the substrate or substrates is linked to the housing 20 by a shaft 25 constituting the second axis B, at right angles to the first axis A and to the plane of the support receiving the substrate or substrates, such that this support can rotate about this axis B.

The second motor 22 disposed in the housing is configured to control the rotation of the substrate support 27 in its plane about the axis B, here through a cascade of pinions 220 driving the shaft 25 in rotation.

The housing further comprises a balancing weight 29 disposed in the housing so as to compensate the weight of the substrate support 27 equipped with the substrate or substrates to be treated, with respect to said first axis A.

The arm 18 of the cover, opposite the arm receiving the motor axis, receives a tubular mounting axis 23 of the housing which is provided with a grommet 26 to serve as entry for one or more power supply and control cables 34 for the motors from the motor control electronics and which pass through the plate.

The driving of the motors is handled by the processor board 16 through the control electronics 33.

Figure 4:
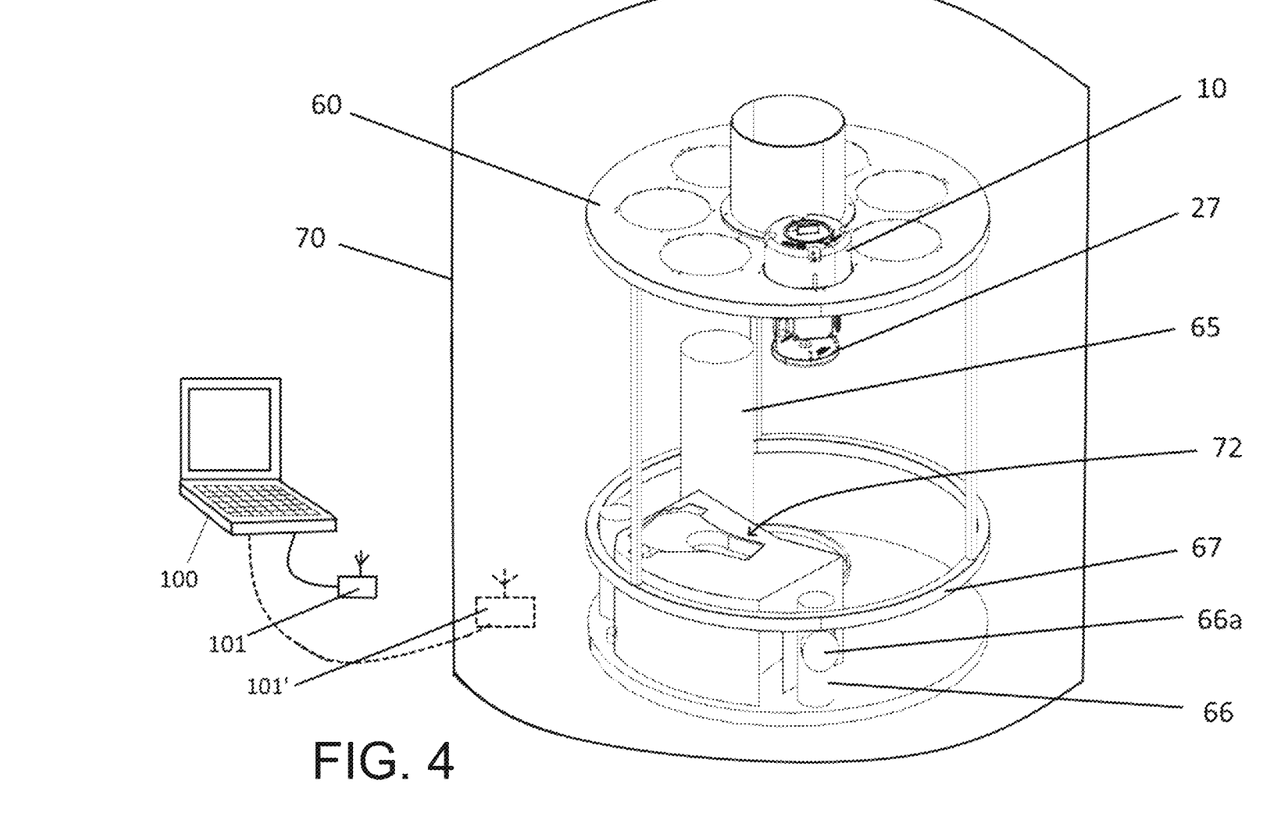
FIG. 4 shows a substrate treatment machine equipped with modules according to FIG. 1.

For this, the processor board comprises an embedded computer program suitable for controlling the movements of the motors on the basis of data received from a remote device 100 represented in FIG. 4.

This remote device 100, such as a computer, is provided with a radio transmitter/receiver device for communication with the transmission/reception electronics of the module 10. The transmitter/receiver device 101 can be situated outside of the vacuum chamber and linked directly to the remote device or even integrated in that device.

According to the dotted-line variant in FIG. 4, the transmitter/receiver device 101' can be situated in the chamber 70 and linked to said remote device by a wired link passing through a wall of the chamber in the case where the metal walls of the chamber prevent any radio transmission between the inside and the outside of the chamber.

Still according to FIG. 4, the modules 10 are fixed onto a carousel 60 which is driven in rotation by a motor 66 that makes a rail 67 supporting the carousel rotate in order to position the modules with respect to the deposition means 72 such as a vapor flow source for the deposition of a type that is known per se. The deposition machine also comprises, according to the example, an ion gun 65 which is used for the ion etching of the parts or for ion assistance during the depositions.

The motor 66 driving the carousel can itself be controlled by the remote device by radio link. Other carousel driving configurations are possible in the context of the application.

The remote device 100 transmits commands to displace the substrate support borne by the module and the module operation supervision program, in the program memory of the module, drives the motors as a function of said commands according to traditional servomotor driving algorithms.

The exchanges between the remote device 100 and the module or modules in the vacuum chamber are done through the radio link linking the transmitter/receiver device and the radio transmission/reception electronics 30 of the module.

Because of the use of modules in a vacuum chamber 70, it is not possible to dissipate the heat produced by the motors and the electronics of the modules by convection. The modules include, as thermal protection means, one or more temperature sensors such as, for example, the sensor 53 on the electronics represented in FIG. 2 and the sensors 51, 52 on or in proximity to the servomotors represented in FIG. 1. It should be noted that it is possible to equip a single motor with a temperature sensor. These sensors can be thermocouples.

These sensors are linked to analog/digital conversion means as are also known on the processor board for the monitoring of the temperatures at these sensitive points. The temperature data measured by the processor board by means of the temperature sensors are transmitted by electromagnetic waves to the remote device which supervises the operation of the machine.

With respect to manufacturing, the frame and the housing are lightweight structures which can be produced by 3D stereo-lithography from a material with a very low thermal coefficient and such as a material known by the tradename PerFORM. This material needs to be able to sustain the high temperatures of the thermal radiations generated by the deposition method and in particular the radiations originating from an infrared lamp which is used to heat the optical parts to the temperature specified for the deposition, the heat of a neutralizing filament of the ion gun used for the surface etching before deposition and/or for the ion assistance during deposition, and the heat radiated by the evaporation source used for the deposition.

The use of a material with a low thermal coefficient for the mechanical structure of the module allows it to be used up to a temperature of 200° C.

The servomotors are rendered compatible with vacuum use at high temperature by replacing the standard grease of the pinions with a vacuum grease and by wiring up the motor electrical control wires with a PTFE sheath.

Returning to FIG. 2, the top part of the module comprising the electronic circuit board or boards 15 is covered by a cap 40, here provided with:
- a module power supply switch 42,
- a removable cover 43, the removal of which allows access to the processor board for the programming thereof, for example through a USB socket integral to said electronic circuit board,
- pumping vents 41, and
- a battery recharge connector 45.

The switch and the power supply connector are linked in a conventional way to the electronic circuit board by wired electrical links, for example in a cable with PTFE insulation 46.

The cap is fixed onto columns 440 arising from the top face of the plate 11 by fixing means such as screws 44 and forms, with the plate, an electronic housing for protecting the electronics of the module.

The pumping vents in the form of four holes are dimensioned to allow the electronic housing to be placed in a vacuum but also the servomotor housing via the openings in the arms 18 and 19. The servomotor housing also comprises vents that are not represented. These vents prevent one or other of the parts of the module from being at overpressure with respect to the vacuum of the chamber.

Figure 3A:
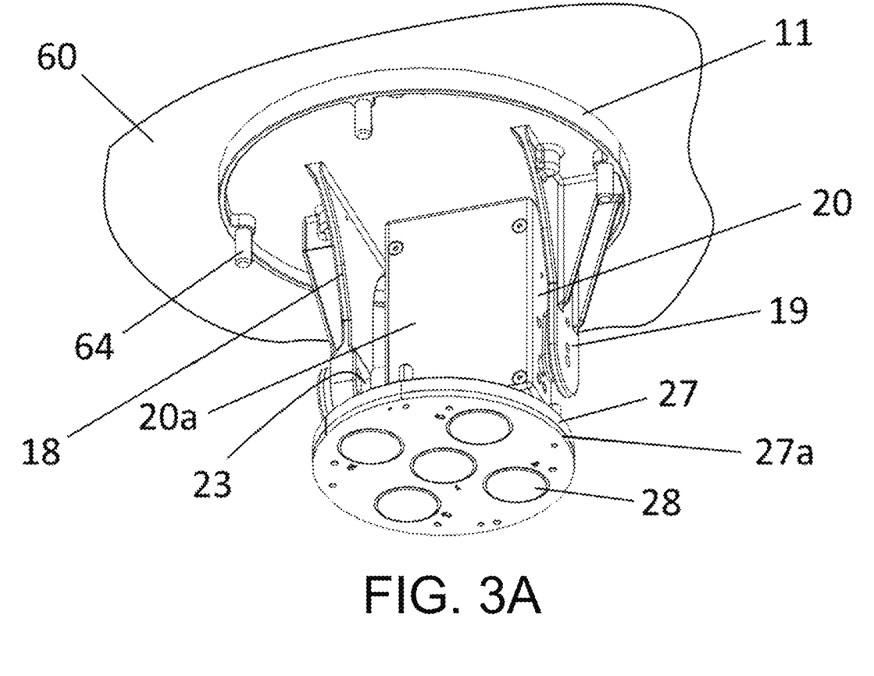
FIG. 3A shows a perspective view of the bottom part of the module of FIG. 1.

FIG. 3A represents the bottom part of the module in perspective with the housing 20 closed by a cap 20a. This figure shows the heads of screws 64 for fixing the module onto the carousel 60. These screws are captive screws mounted from below and secured to the plate 11.

Figure 3B:
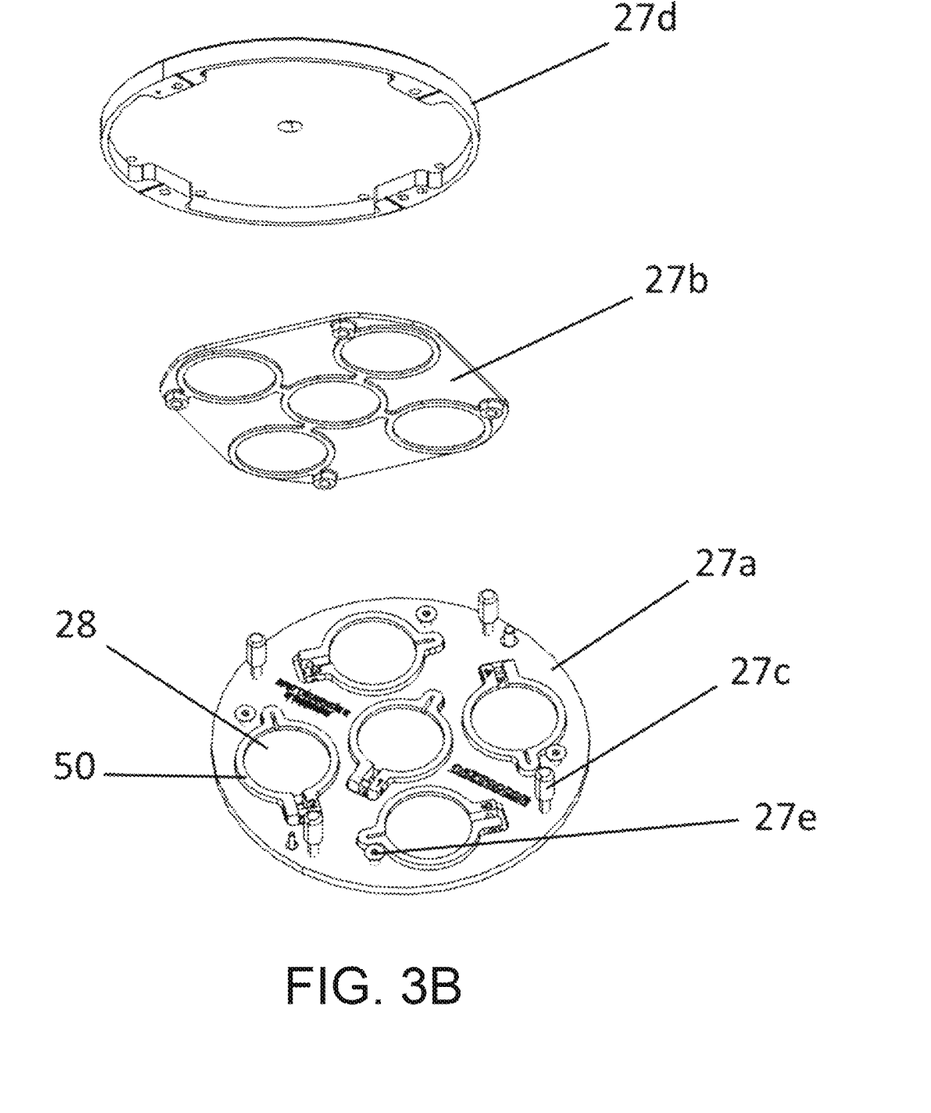
FIG. 3B shows a detail of FIG. 3A.

According to FIG. 3B, the substrate support comprises a baseplate 27a, a backplate 27b and a support cap 27d. The baseplate and the cap are screwed together with screws 27c, the backplate is screwed onto the baseplate by means of screws 27e. The substrates 28, held by substrate gripping clamps 50, are mounted between the baseplate 27a and the backplate 27b which tighten the gripping clamps 50 of the substrates 28.

The clamps are placed in suitable cavities of the plate 27a. The backplate 27b is screwed onto the plate 27a and bears on the clamps which are thus firmly held. The rear faces of the substrates are thus protected from the depositions. The assembly is then screwed onto the PEEK support cap 27d which remains secured to the module.

It should be noted that, on the plate 27a, there is a small screw with washer (not represented) for tightening and holding a thermocouple which measures the temperature of the substrates 28.

The plate 27a is preferably a stainless steel plate like the clamps 50. This material perfectly conducts the heat and makes the temperature of the parts treated uniform. The cap 27d is preferably of heat-resistant plastic material such as PEEK. This cap is machined mechanically. PEEK exhibits excellent resistance to deformation at high temperature.

The heat generated inside the chamber is conveyed solely by thermal radiation, so the electronic housing 40 and the housing 20 of the servomotors are covered with an aluminum film which reflects this thermal radiation and greatly slows down the heating up of these housings.

The use of 3D stereolithography to produce the mechanical parts of the module, together with the miniaturization of the electronic circuit boards, allows for the design of a tool that is very compact and very lightweight, which facilitates the use and maintenance thereof.

The system of the present application makes it possible to produce an industrial tool compatible with the series production of optical treatments by thin layers according to the GLAD method, in the visible range and the infrared range.

The module of the present application allows the displacement of optical parts, discretely or continuously, from the horizontal position to the vertical position. It allows an azimuthal rotation of the substrate supports of 180° (even 360°), discrete or continuous. Thus, all the experimental possibilities of GLAD depositions can be accessed with this module.

The miniaturization and the compactness of the module makes it possible to put in place several modules on a revolving carousel 60. Seven modules are for example distributed on the carousel. According to FIG. 4, a single module is represented, the other locations being free. In the case where the substrate supports bear five substrates, this disposition allows 35 substrates to be treated simultaneously. Moreover, the design of the module with an electronic part and a motor part that are separated by a plate allows, on the one hand, simple mounting of the modules on the carousel by means of the screws 64 of FIGS. 1 and 3A for example, and, on the other hand, the electronic parts of the modules to be isolated from the hot zone of the chamber when the modules are mounted on the carousel which forms a thermal protection screen for the electronic parts of the modules.

Finally, the module which makes it possible to orient the substrate supports as required allows for the production of multilayers without intermediate openings of the chamber which eliminates the problem of moisturization of the layers, this problem being very critical, particularly in the infrared spectral range.

The device and the machine of the present application allow deposits to be made on lenses or windows requiring very high efficiency antireflection treatments and wide spectral ranges, notably in the extended visible and infrared ranges.

The modules of the invention thus allow:
  the production of multilayer deposits on the substrates held by the substrate support at variable incidences between the horizontal position and the vertical position, in static mode and in dynamic mode, for example by steps of 1 degree depending on the precision of the servomotors used;
  a rotation of the substrate or substrates of at least 180 degrees in the plane of the substrate in order to orient the columnar growth of the layers of deposits;
  the production of deposits on optical parts of variable size simply by changing substrate support typically for diameters from 20 to 120 mm;
  the production of multilayer deposits without opening the chamber in order to avoid the phenomena of oxidation or moisturization at the interfaces;
  the heating of the optical parts to a temperature of 200° C., over a period compatible with the duration of the treatments envisaged;
  the installation of modules on the industrial deposition machines that have a revolving carousel;
  the installation of several modules in one and the same chamber to allow series production without complex wired links, each module being linked to the remote device by radio link.

The design of the system and of the modules makes it possible to control the motors by inter-cavity electronics in order to overcome constraints associated with rotating electrical links and to power the electronics and the motors by an inter-cavity low-voltage electrical source by means of a battery that is rechargeable and compatible with vacuum use at high temperature, in order to ensure the safety of the module.

The invention is not limited to the example represented and, in particular, the substrate supports can bear one to several substrates and the carousel can comprise recesses for more or fewer than seven modules depending on the size of the treatment machine. The modules of the present application can also be used for treatments other than depositions according to the GLAD method.

The invention claimed is:

1. A module for maneuvering a substrate support of one or more substrates to be treated in a vacuum deposition method, comprising a frame provided with a plate receiving, on a first side, an electronic assembly comprising radio transmission/reception electronics, a processor board, motor control electronics and a module power supply battery, wherein the processor board comprises a program memory comprising a program configured to control the motor control electronics on the basis of data received from a remote device provided with a radio transmitter/receiver device for communication with the transmission/reception electronics of the module and, wherein said plate comprises on a second side, a maneuvering device configured to maneuver said support provided with a first motor that maneuvers the support in rotation about a first axis parallel to the plate and a second motor that maneuvers said support in rotation about a second axis at right angles to said support.

2. The module according to claim 1, wherein the motor control electronics are low-voltage electronics and the first and second motors are micro-servomotors configured to be electronically controlled at low voltage.

3. The module according to claim 1, wherein the maneuvering device comprises a cover receiving a housing, rotationally mobile with respect to the cover about the first axis under the action of the first motor for tilting the housing, the housing enclosing the second motor to which said support is linked by a rotary shaft on the second axis, said second motor being configured to control rotation of said support in its plane about the second axis, and enclosing a balancing weight that compensates for a weight of said support equipped with the substrate or one or more substrates to be treated with respect to said first axis.

4. The module according to claim 3, wherein the cover comprises a base formed by the plate and two arms, a distal end of which bears the first axis, and for wherein one of the arms of the cover receives a tube for mounting said housing about the first axis, said tube being provided with a grommet providing an entry for power supply and control cables for the first and second motors, passing through the plate and issuing from the motor control electronics.

5. The module according to claim 3, wherein the first motor is disposed in the housing and comprises a motor shaft received in an arm of two arms of the cover and being configured to rotate the housing with respect to the cover on the first axis.

6. The module according to claim 1, further comprising one or more temperature sensors located with at least one of said first motor, said second motor, and/or the electronic assembly, and the substrate support, said one or more temperature sensors being linked to the processor board, the program configured to control the motor control electronics being provided with a temperature management module configured to transmit temperature data through the radio transmission/reception electronics to said remote device provided with a module operation supervision program.

7. The module according to claim 1, wherein the plate constitutes a means for fixing the module onto a module support passed through by the module.

8. The module according to claim 1, wherein the substrate support comprises a baseplate and a backplate and wherein holding clamps for the one or more substrates are gripped between the baseplate and the backplate.

9. A vacuum deposition machine comprising a vacuum chamber and means for depositing thin layers on a substrate in the vacuum chamber, comprising a module configured to maneuver a substrate support of one or more substrates to be treated in a vacuum deposition method, comprising a frame provided with a plate receiving, on a first side, an electronic assembly comprising radio transmission/reception electronics, a processor board, motor control electronics and a module power supply battery, wherein the processor board comprises a program memory comprising a program configured to control the motor control electronics on the basis of data received from a remote device provided with a radio transmitter/receiver device in communication with the transmission/reception electronics of the module, wherein said plate comprises on a second side, a device configured to maneuver said support provided with a first motor that maneuvers the support in rotation about a first axis parallel to the plate and a second motor that maneuvers said support in rotation about a second axis at right angles to said support, said module being disposed in the chamber and the remote device provided with a module operation supervision program disposed outside of the chamber, said remote device being provided with the radio transmitter/receiver device being configured to set up a radio link with the transmission/reception electronics of said module to drive movements of the housing and of the substrate support, said radio transmitter/receiver device being situated outside of the chamber or inside the chamber and linked to said remote device by a wired link passing through a wall of the chamber.

10. The vacuum deposition machine according to claim 9, further comprising a plurality of said module fixed onto a module support disposed in the chamber, the modules and the module support being driven together or independently by said remote device to orient the one or more substrates borne by the substrate support of each of the modules with respect to the deposition means according to variable incidences during a vacuum multilayer deposition method.

11. The vacuum deposition machine according to claim 10, wherein the module support forms thermal separation between the first side of the plate of each of the modules provided with the electronic assembly and the second side of the plate of each of the modules provided with the maneuvering device and the substrate support.

12. The vacuum deposition machine according to claim 9, wherein the remote device is a computer or calculator provided with a human-machine interface configured to program multilayer deposition conditions by an operator and interfaced with the module through the radio link to remotely drive the module disposed in the chamber on the basis of said program.

13. The vacuum deposition machine according to claim 9 wherein the motor control electronics is low-voltage electronics and the first and second motors are micro-servomotors configured to be electronically controlled at low voltage.

14. The vacuum deposition machine according to claim 9, wherein the maneuvering device comprises a cover receiving a housing, rotationally mobile with respect to the cover about the first axis under the action of the first motor for tilting the housing, the housing enclosing the second motor to which said support is linked by a rotary shaft on the second axis, said second motor being configured to control the rotation of said support in its plane about the second axis, and enclosing a balancing weight that compensates for a weight of said support equipped with the one or more substrates to be treated with respect to said first axis.

15. The vacuum deposition machine according to claim 14, wherein the cover comprises a base formed by the plate and two arms, a distal end of which bears the first axis, and for wherein one of the arms of the cover receives a tube for mounting said housing about the first axis, said tube being provided with a grommet providing an entry for power supply and control cables for the first and second motors, passing through the plate and issuing from the motor control electronics.

16. The vacuum deposition machine according to claim 14, wherein the first motor is disposed in the housing and comprises a motor shaft received in an arm of two arms of the cover in order to rotate the housing with respect to the cover on the first axis.

17. The vacuum deposition machine according to claim 9, further comprising one or more temperature sensors located with at least one of said first motor, said second motor, the electronic assembly, and the substrate support, said one or more temperature sensors being linked to the processor board, the program configured to control the motor control electronics being provided with a temperature management module configured to transmit temperature data through the radio transmission/reception electronics to said remote device provided with the module operation supervision program.

18. The vacuum deposition machine according to claim 9, wherein the plate comprises a means to fix the module onto a module support passed through by the module.

19. The vacuum deposition machine according to claim 9, wherein the substrate support comprises a baseplate and a backplate and wherein holding clamps for the one or more substrates are gripped between the baseplate and the backplate.

* * * * *